US012720855B2

(12) United States Patent
Lin et al.

(10) Patent No.: US 12,720,855 B2
(45) Date of Patent: Aug. 25, 2026

(54) FIN PITCH OPTIMIZATION FOR UNIFORM SOURCE/DRAIN STRUCTURES

(71) Applicant: Taiwan Semiconductor Manufacturing Company, Ltd., Hsinchu (TW)

(72) Inventors: Yu-Hung Lin, Taipei City (TW); Wei Hsin Lin, Taichung City (TW); Hui-Hsuan Kung, Taichung City (TW); Yi-Lii Huang, Zhubei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 323 days.

(21) Appl. No.: 18/501,161

(22) Filed: Nov. 3, 2023

(65) Prior Publication Data

US 2025/0151381 A1 May 8, 2025

(51) Int. Cl.

*H10D 84/83* (2025.01)
*H10D 84/01* (2025.01)
*H10D 84/03* (2025.01)

(52) U.S. Cl.

CPC ....... *H10D 84/834* (2025.01); *H10D 84/0158* (2025.01); *H10D 84/038* (2025.01)

(58) Field of Classification Search

CPC ............. H10D 84/013; H10D 84/0158; H10D 84/038; H10D 84/834

See application file for complete search history.

(56) References Cited

U.S. PATENT DOCUMENTS

| | | | | |
|---|---|---|---|---|
| 9,093,530 | B2 | 7/2015 | Huang et al. | |
| 9,171,929 | B2 | 10/2015 | Lee et al. | |
| 9,214,555 | B2 | 12/2015 | Oxland et al. | |
| 9,236,267 | B2 | 1/2016 | De et al. | |
| 9,520,482 | B1 | 12/2016 | Chang et al. | |
| 9,548,303 | B2 | 1/2017 | Lee et al. | |
| 9,564,489 | B2 | 2/2017 | Yeo et al. | |
| 9,576,814 | B2 | 2/2017 | Wu et al. | |
| 9,601,342 | B2 | 3/2017 | Lee et al. | |
| 9,608,116 | B2 | 3/2017 | Ching et al. | |
| 2016/0284700 | A1 | 9/2016 | Yoon et al. | |
| 2021/0313181 | A1 | 10/2021 | Chen et al. | |
| 2022/0393000 | A1 | 12/2022 | More | |
| 2022/0415888 | A1 | 12/2022 | Hsieh et al. | |
| 2023/0123868 | A1* | 4/2023 | More .................. | H10D 30/797 257/369 |
| 2023/0207628 | A1 | 6/2023 | Cho et al. | |
| 2024/0021618 | A1* | 1/2024 | Chin .................. | H10D 84/0151 |

* cited by examiner

*Primary Examiner* — Hoai V Pham
(74) *Attorney, Agent, or Firm* — Sterne, Kessler, Goldstein & Fox P.L.L.C.

(57) ABSTRACT

The present disclosure describes a semiconductor device having fin structures with optimized fin pitches for substantially uniform S/D structures. The semiconductor device includes multiple fin structures on a substrate. The multiple fin structures have a first pitch and a second pitch in an alternate configuration and the second pitch is different from the first pitch. The semiconductor device further includes a gate structure on the multiple fin structures and a source/drain (S/D) structure adjacent to the gate structure and in contact with the multiple fin structures.

20 Claims, 13 Drawing Sheets

FIN PITCH OPTIMIZATION FOR UNIFORM SOURCE/DRAIN STRUCTURES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes and increased the difficulty of defects control in the semiconductor devices.

BRIEF DESCRIPTION OF THE DRAWINGS

Illustrative embodiments will now be described with reference to the accompanying drawings. In the drawings, like reference numerals generally indicate identical, functionally similar, and/or structurally similar elements.

DETAILED DESCRIPTION

Figure 1:
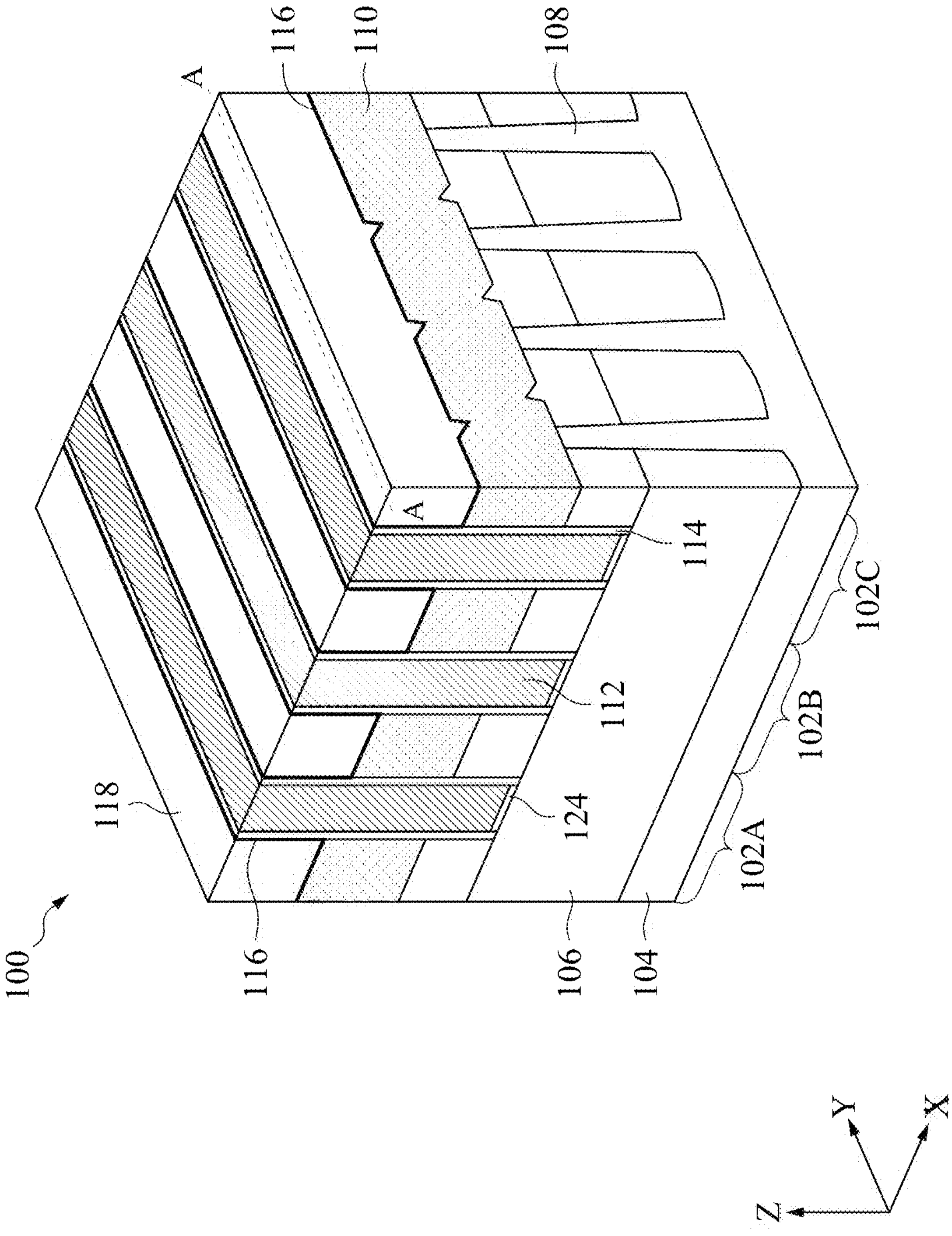
FIG. 1 illustrates an isometric view of a semiconductor device having optimized fin pitches for substantially uniform source/drain structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

With increasing demand for lower power consumption, higher performance, and smaller semiconductor devices, dimensions of semiconductor devices continue to scale down. The continuous scaling down of device dimensions and the increasing demand for device performance may require various process and material improvements, which can have multiple challenges. For example, a multi-fin device can have a gate structure on multiple fin structures. A merged source/drain (S/D) epitaxial structure can be formed on the multiple fin structures. With a substantially same fin pitch across the multiple fin structures, spacings between adjacent fin structures of the multiple fin structures may vary due to etching process variations (e.g., loading effects between different fin structures). The spacing variations of the multiple fin structures can lead to non-uniform growth of the S/D epitaxial structure on the multiple fin structures, for example, a dentate S/D epitaxial structure and/or unmerged S/D epitaxial structures. The dentate S/D epitaxial structure can increase contact resistance between the S/D epitaxial structure and the contact structures. The unmerged epitaxial structures can cause contact metal extrusion issues. As a result, the multi-fin device can have degraded device performance (e.g., lower linear drain current Id_lin due to higher contact resistance) and reduced device reliability (e.g., contact metal extrusion due to unmerged epitaxial structures).

Various embodiments in the present disclosure provide methods for forming fin structures having optimized fin pitches for substantially uniform S/D structures in a semiconductor device (e.g., a multi-fin nanostructure transistor)

and/or other semiconductor devices in an integrated circuit (IC). In some embodiments, multiple fin structures can be formed on a substrate. The multiple fin structures can have first and second pitches in an alternate configuration. In some embodiments, the second pitch can be less than the first pitch. In some embodiments, a ratio of the second pitch to the first pitch can range from about 95% to about 99.5%. A gate structure can be formed on the multiple fin structures. A S/D structure can be formed on the multiple fin structures and adjacent to the gate structure. With the multiple fin structures having the first and second pitches in an alternate configuration, the S/D structure can have a more uniform thickness across the multiple fin structures. Accordingly, the device performance and reliability of the semiconductor device can be improved. In some embodiments, the device performance of a semiconductor device having optimized fin pitches for substantially uniform S/D structures can be improved by about 3% to about 8%.

Figure 2:
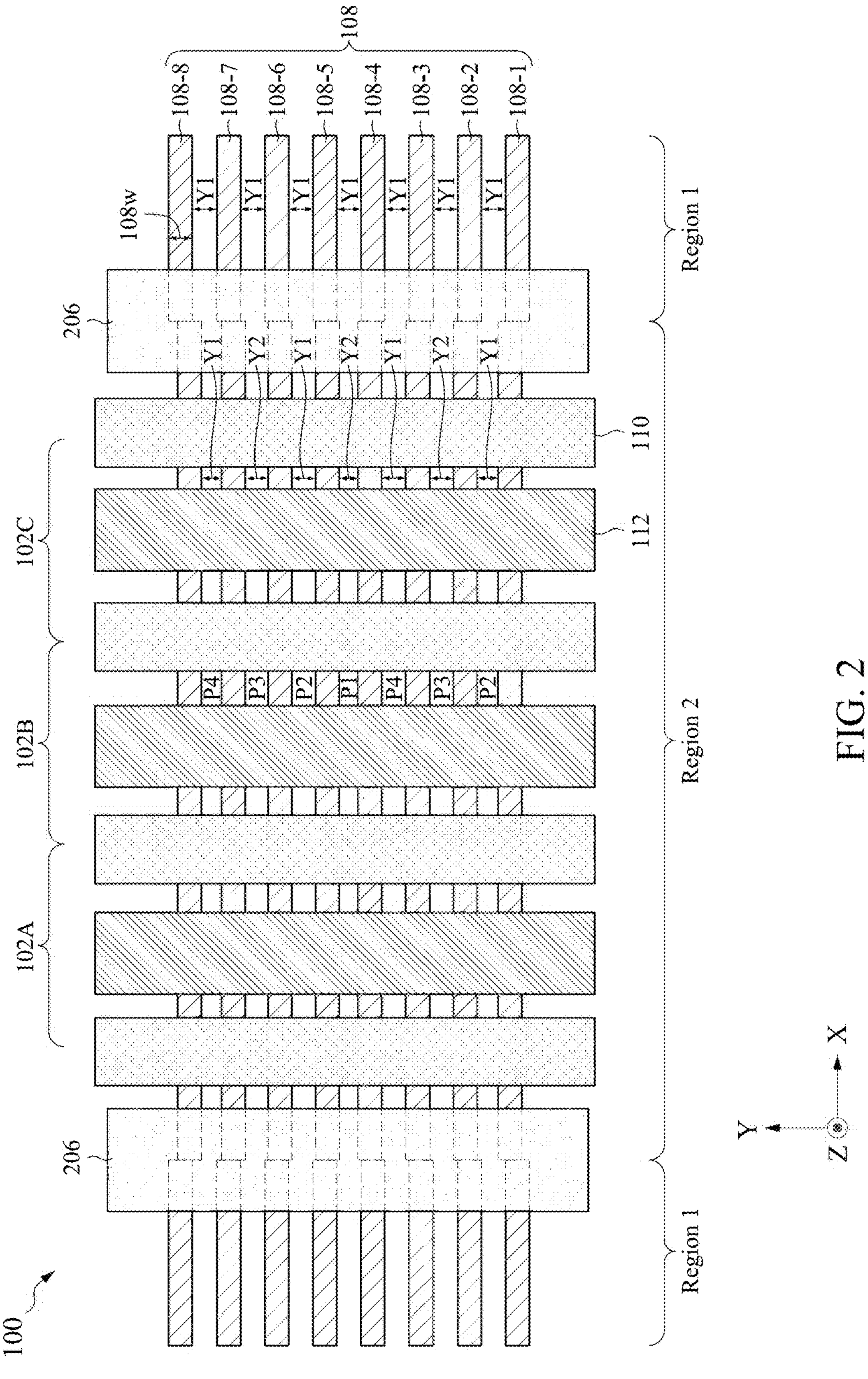
FIG. 2 illustrates a plan view of a semiconductor device having optimized fin pitches for substantially uniform source/drain structures, in accordance with some embodiments.
Figure 3:
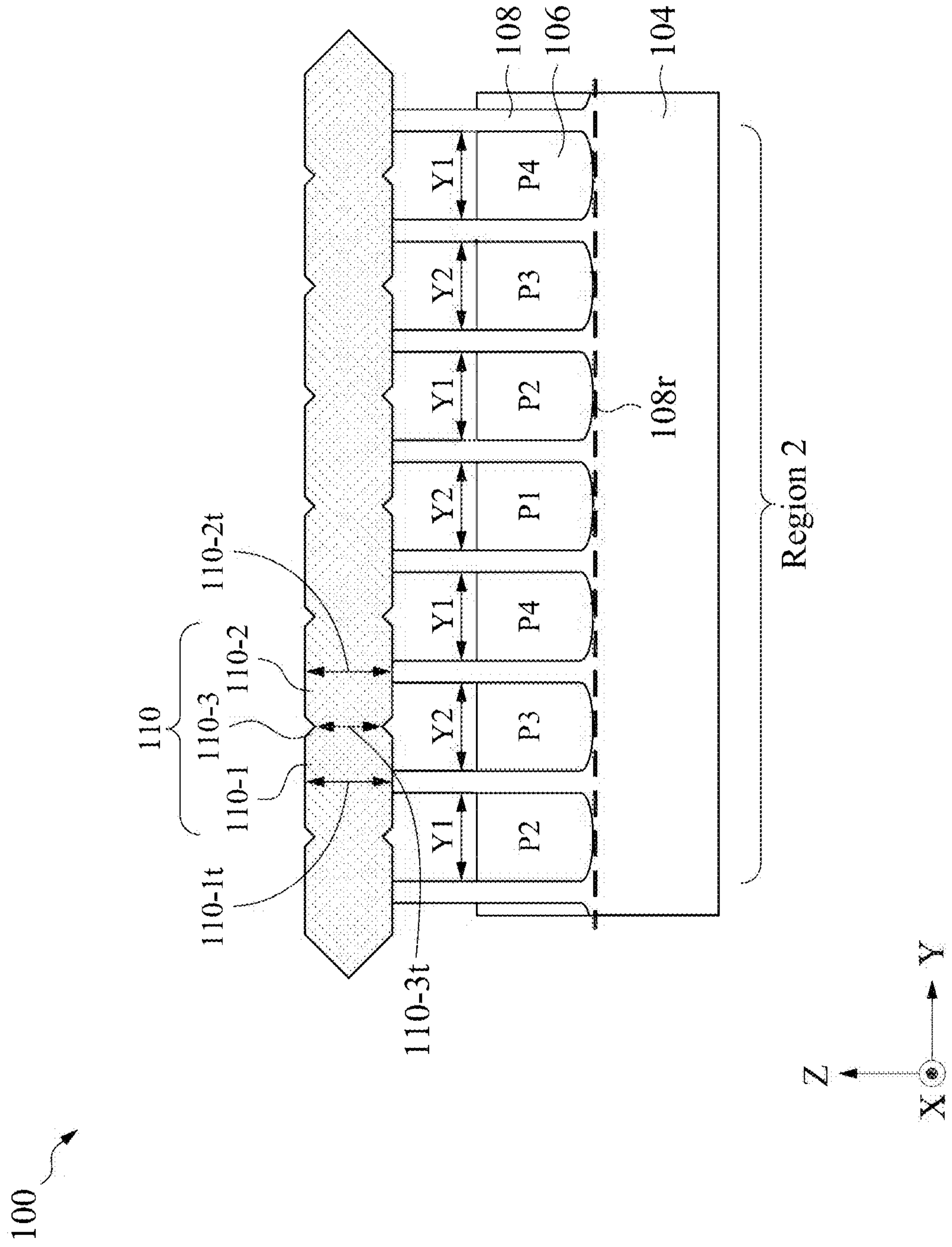
FIG. 3 illustrates a cross-sectional view of a semiconductor device having optimized fin pitches for substantially uniform source/drain structures, in accordance with some embodiments.

FIG. 1 illustrates an isometric view of a semiconductor device 100 having optimized fin pitches for substantially uniform source/drain structures, in accordance with some embodiments. FIG. 2 illustrates a plan view of semiconductor device 100, in accordance with some embodiments. FIG. 3 illustrates a cross-sectional view of semiconductor device 100 across line A-A shown in FIG. 1, in accordance with some embodiments. In some embodiments, semiconductor device 100 can include multi-fin transistors 102A-102C in region 2, as shown in FIGS. 1-3, and other transistors (e.g., single-fin transistors) in region 1 (not shown). In some embodiments, multi-fin transistors 102A-102C can include nanostructure transistors. The nanostructure transistors can include finFETs, gate-all-around field effect transistors (GAA FETs), nanosheet transistors, nanowire transistors, multi-bridge channel transistors, nano-ribbon transistors, and other similar structured transistors. The nanostructure transistors can provide a channel in a stacked nanosheet/nanowire configuration.

In some embodiments, multi-fin transistors 102A-102C can be n-type field-effect transistors (NFETs). In some embodiments, multi-fin transistors 102A-102C can be p-type field-effect transistors (PFETs). In some embodiments, any of multi-fin transistors 102A-102C can be an NFET or a PFET. Though FIG. 1 shows three multi-fin transistors, semiconductor device 100 can have any number of multi-fin transistors and any number of other transistors. In addition, semiconductor device 100 can be incorporated into an IC through the use of other structural components, such as contact structures, conductive vias, conductive lines, dielectric layers, passivation layers, and interconnects, which are not shown for simplicity. The discussion of elements of transistors 102A-102C with the same annotations applies to each other, unless mentioned otherwise. And like reference numerals generally indicate identical, functionally similar, and/or structurally similar elements.

Referring to FIGS. 1-3, semiconductor device 100 can be formed on a substrate 104 and can be isolated by shallow trench isolation (STI) regions 106 and isolation structures 206. Each of transistors 102A-102C can include multiple fin structures 108-1 to 108-8 (collectively referred to as "fin structures 108"), gate dielectric layer 124, gate structures 112, gate spacers 114, S/D structures 110, etch stop layer (ESL) 116, and interlayer dielectric (ILD) layer 118.

Referring to FIGS. 1-3, substrate 104 can include a semiconductor material, such as silicon. In some embodiments, substrate 104 includes a crystalline silicon substrate (e.g., wafer). In some embodiments, substrate 104 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, and/or aluminum gallium arsenide; or (iv) a combination thereof. Further, substrate 104 can be doped depending on design requirements (e.g., p-type substrate or n-type substrate). In some embodiments, substrate 104 can be doped with p-type dopants (e.g., boron, indium, aluminum, or gallium) or n-type dopants (e.g., phosphorus or arsenic).

STI regions 106 and isolation structures 206 can provide electrical isolation between transistors 102A-102C and from neighboring transistors (not shown) on substrate 104 and/or neighboring active and passive elements (not shown) integrated with or deposited on substrate 104. In some embodiments, isolation structures 206 can separate multi-fin devices (e.g., transistors 102A-102C) in region 2 from other devices in region 1. STI regions 106 and isolation structures 206 can be made of a dielectric material. In some embodiments, STI regions 106 and isolation structures 206 can include silicon oxide, silicon nitride, silicon oxynitride, fluorine-doped silicate glass (FSG), a low-k dielectric material, and/or other suitable insulating materials. In some embodiments, STI regions 106 and isolation structures 206 can include a multi-layered structure.

Referring to FIGS. 1-3, fin structures 108 can be formed on patterned portions of substrate 104. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers can be formed alongside the patterned sacrificial layer using a self-aligned process. The sacrificial layer is then removed, and the remaining spacers can then be used to pattern the fin structures.

In some embodiments, as shown in FIG. 2, semiconductor device 100 can include region 2 having multi-fin transistors 102A-102C and region 1 having other transistors, such as single-fin transistors (not shown). In some embodiments, isolation structures 206 can separate fin structures 108 in region 2 from fin structures 108 in region 1. In some embodiments, as shown in FIG. 2, adjacent four fin structures 108 having pitches P1, P2, P3, and P4 can be formed by one sacrificial patterning structure, as described in detail below. In some embodiments, fin structures 108 in region 1 can have a common first pitch Y1. In some embodiments, first pitch Y1 can range from about 15 nm to about 25 nm along a Y-axis for process control of fin structure uniformity across substrate 104 and between different substrates. In some embodiments, fin structures 108 in region 2 can have first pitch Y1 and a second pitch Y2 in an alternate configuration. In some embodiments, second pitch Y2 can be less than first pitch Y1. In some embodiments, a ratio of second pitch Y2 to first pitch Y1 can range from about 95% to about 99.5%. If the ratio is less than about 95% or greater than about 99.5%, subsequently-formed S/D structures 110 on fin structures 108 in region 2 may be dentate or unmerged, and the device performance and reliability of semiconductor device 100 may be reduced. In some embodiments, with first pitch Y1 and second pitch Y2 in an alternate configuration, fin structures 108 in region 2 can have a substantially uniform recess 108*r* between fin structures 108 and on substrate 104. In some embodiments, bottom surfaces of recess 108*r* between fin structures 108 can be aligned at a substantially same level, as shown in FIG. 3.

In some embodiments, fin structures 108 in region 1 and region 2 can have a width 108*w* along a Y-axis ranging from about 3 nm to about 10 nm. In some embodiments, a ratio of first pitch Y1 to width 108*w* can range from about 2 to about 5. If the ratio is less than about 2 or greater than about 5, it would be more difficult to control the fin structure uniformity across substrate 104 and between different substrates. In some embodiments, fin structures 108 in region 1 can have a first fin height along a Z-axis ranging from about 100 nm to about 150 nm. Fin structures 108 in region 2 can have a second fin height along a Z-axis ranging from about 100 nm to about 135 nm. The difference between the first and second fin heights can be due to the fin pitch differences in regions 1 and 2 and etching process variations for different fin pitches. In some embodiments, a ratio of the difference between the first and second fin heights to the first fin height can range from about 2% to about 10%. In some embodiments, as shown in FIG. 2, fin structure 108-5 in region 1 and region 2 can be aligned while fin structures 108-1, 108-2, 108-3, 108-4, 108-6, 108-7, and 108-8 can be misaligned due to the fin pitch differences in region 1 and region 2.

As shown in FIGS. 1-3, fin structures 108 can extend along an X-axis for transistors 102A-102C. In some embodiments, fin structures 108 can be disposed on substrate 104. In some embodiments, fin structures 108 can include semiconductor materials similar to or different from substrate 104. In some embodiments, fin structures 108 can include silicon. In some embodiments, fin structures 108 can include silicon germanium. The semiconductor materials of fin structures 108 can be undoped or can be in-situ doped during their formation process. In some embodiments, fin structures 108 under gate structures 112 can form channel regions of semiconductor device 100 and represent current carrying channel structures of semiconductor device 100. Though four fin structures are shown in FIG. 1 and eight fin structures are shown in FIGS. 2 and 3, transistors 102A-102C can have any number of fin structures 108.

Referring to FIGS. 1-3, gate dielectric layer 124 can be formed on fin structures 108 and STI regions 106. In some embodiments, gate dielectric layer 124 can be multi-layered structures and can include an interfacial layer and a high-k dielectric layer. In some embodiments, gate dielectric layer 124 can include no interfacial layer and a high-k dielectric layer in direct contact with fin structures 108 and STI regions 106. In some embodiments, the interfacial layer can include silicon oxide formed by a deposition process or an oxidation process. In some embodiments, the interfacial layer can have a thickness ranging from about 0.1 nm to about 1.5 nm. In some embodiments, the high-k dielectric layer can include hafnium oxide, zirconium oxide, or other suitable high-k dielectric materials.

In some embodiments, as shown in FIGS. 1-3, gate structures 112 can be disposed on gate dielectric layer 124 over fin structures 108 and STI regions 106. In some embodiments, gate structures 112 can include one or more work function metal layers and a metal fill. The one or more work function metal layers can include work function metals to tune the threshold voltage (Vt) of transistors 102A-102C. In some embodiments, NFETs 102A-102C can include n-type work function metal layers. The n-type work function metal layers can include aluminum, titanium aluminum, titanium aluminum carbon, tantalum aluminum, tantalum aluminum carbon, tantalum silicon carbide, hafnium carbide, silicon, titanium nitride, titanium silicon nitride, or other suitable work function metals. In some embodiments, PFETs 102A-102C can include p-type work function metal layers. The p-type work function metal layers can include titanium nitride, titanium silicon nitride, tantalum nitride, tungsten carbon nitride, tungsten, molybdenum, or other suitable work function metals. In some embodiments, the work function metal layers can include a single metal layer or a stack of metal layers. The stack of metal layers can include work function metals having work-function values substantially equal to or different from each other. In some embodiments, the metal fill can include titanium, tantalum, aluminum, cobalt, tungsten, nickel, ruthenium, or other suitable conductive materials.

Referring to FIG. 1, gate spacers 114 can be disposed on sidewalls of gate structures 112. Gate spacers 114 can include insulating materials, such as silicon oxide, silicon nitride, silicon oxynitride, silicon carbonitride, silicon oxycarbide, silicon oxycarbonitride, a low-k material, and a combination thereof. Gate spacers 114 can include a single layer or a stack of insulating layers. Gate spacers 114 can have a low-k material with a dielectric constant less than about 3.9 (e.g., about 3.5, about 3.0, or about 2.8).

S/D structures 110 can be disposed on fin structures 108 and on opposing sides of gate structures 112. S/D structures 110 can function as S/D regions of transistors 102A-102C. In some embodiments, S/D structures 110 can have any geometric shape, such as a polygon, an ellipsis, and a circle. In some embodiments, S/D structures 110 on fin structures 108 in region 2 can be merged for multi-fin transistors 102A-102C. In some embodiments, the merged S/D structures 110 on fin structures 108 in region 2 can be substantially uniform and can have a substantially uniform thickness over fin structures 108. In some embodiments, S/D structures 110 can include a first portion 110-1 on one fin structure 108, a second portion 110-2 on an adjacent fin structure 108, and a third portion 110-3 between the first portion 110-1 and second portion 110-2. In some embodiments, first portion 110-1 can have a thickness 110-1*t* along a Z-axis ranging from about 50 nm to about 80 nm. Second portion 110-2 can have a thickness 110-2*t* along a Z-axis ranging from about 50 nm to about 80 nm. Third portion 110-3 can have a thickness 110-3*t* along a Z-axis ranging from about 40 nm to about 70 nm. In some embodiments, thickness 110-1*t* can be substantially equal to thickness 110-2*t*. In some embodiments, thickness 110-3*t* can be substantially equal to or less than thickness 110-1*t*. In some embodiments, a ratio of thickness 110-3*t* to thickness 110-1*t* or 110-2*t* can range from about 80% to about 100%. If the ratio is less than about 80%, the uniformity of merged S/D structures 110 may be reduced and device performance of semiconductor device 100 may be degraded. In some embodiments, thickness 110-3*t* can be related to first pitch Y1 and second pitch Y2 according to the following equation:

$$110-3t=(Y1-Y2)\times 40$$

In some embodiments, S/D structures 110 can include an epitaxially-grown semiconductor material, such as silicon (e.g., the same material as substrate 104). In some embodiments, the epitaxially-grown semiconductor material can include an epitaxially-grown semiconductor material different from the material of substrate 104, such as silicon germanium, and imparts a strain on the channel regions under gate structures 112. Since the lattice constant of such epitaxially-grown semiconductor material is different from the material of substrate 104, the channel regions are strained to increase carrier mobility in the channel regions of semiconductor device 100. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

In some embodiments, S/D structures 110 can include silicon and can be in-situ doped during an epitaxial growth process using n-type dopants, such as phosphorus and arsenic. In some embodiments, S/D structures 110 can include silicon, silicon germanium, germanium, or III-V materials (e.g., indium antimonide, gallium antimonide, or indium gallium antimonide) and can be in-situ doped during an epitaxial growth process using p-type dopants, such as boron, indium, and gallium. In some embodiments, S/D structures 110 can include one or more epitaxial layers, where each epitaxial layer can have different compositions.

ESL 116 can be disposed on S/D structures 110, STI regions 106, and sidewalls of gate spacers 114. ESL 116 can be configured to protect STI regions 106, S/D structures 110, and gate structures 112 during the formation of S/D contact structures 130 on S/D structures 110. In some embodiments, ESL 116 can include, for example, silicon oxide, silicon nitride, silicon oxynitride, silicon carbide, silicon carbonitride, boron nitride, silicon boron nitride, silicon carbon boron nitride, or a combination thereof.

ILD layer 118 can be disposed on ESL 116 over S/D structures 110 and STI regions 106. ILD layer 118 can include a dielectric material deposited using a deposition method suitable for flowable dielectric materials. For example, flowable silicon oxide can be deposited using flowable chemical vapor deposition (FCVD). In some embodiments, the dielectric material can include silicon oxide.

In some embodiments, semiconductor device 100 can further include gate isolation structures, S/D contact structures, metal lines and metal vias, which are not shown in FIGS. 1-3 for simplicity.

Figure 4:
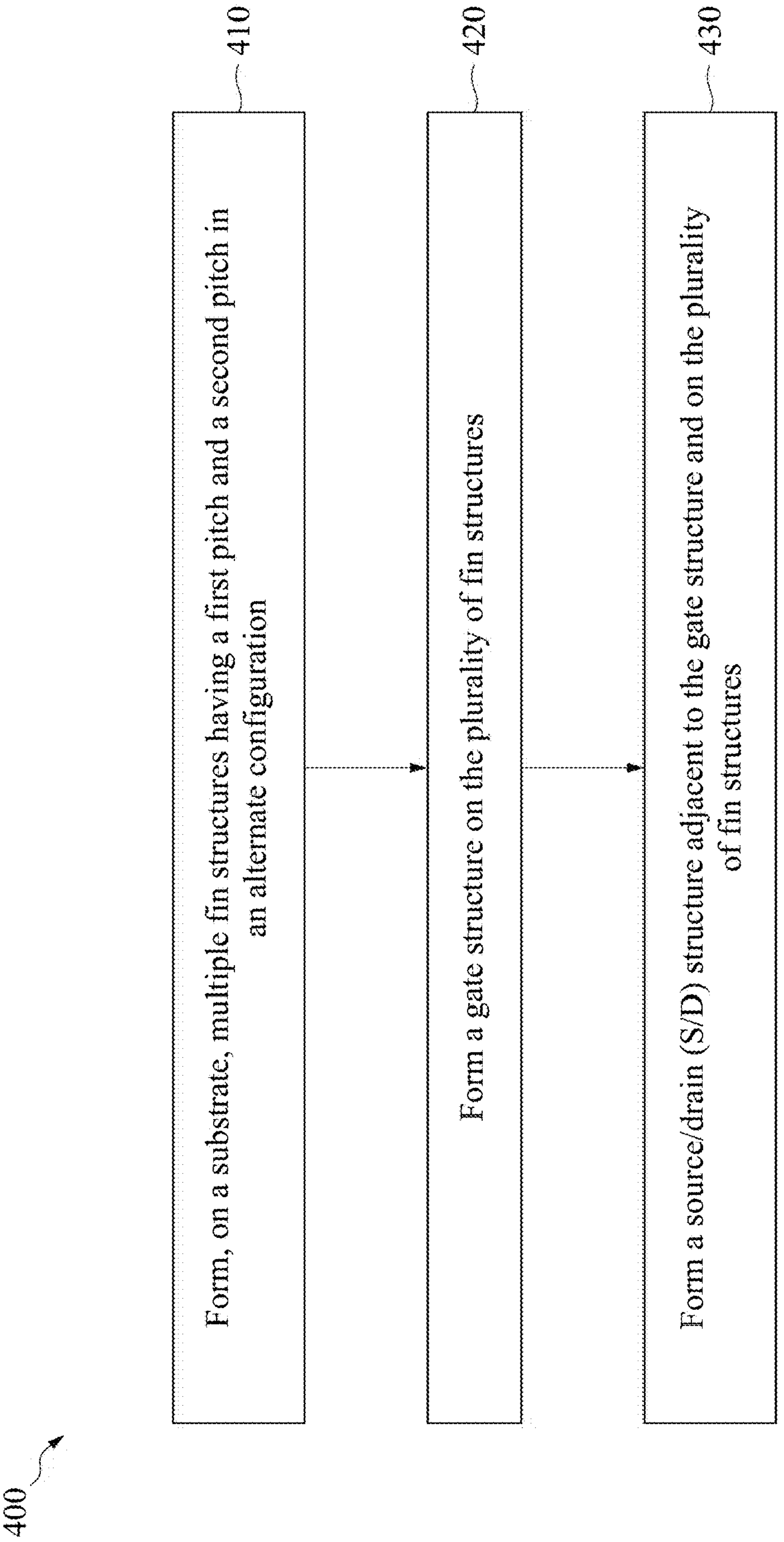
FIG. 4 is a flow diagram of a method for fabricating a semiconductor device having optimized fin pitches for substantially uniform source/drain structures, in accordance with some embodiments.

FIG. 4 is a flow diagram of a method 400 for fabricating semiconductor device 100 having optimized fin pitches for substantially uniform source/drain structures, in accordance with some embodiments. Method 400 may not be limited to multi-fin transistor devices and can be applicable to other devices that would benefit from optimized fin pitches for substantially uniform S/D structures. Additional fabrication operations may be performed between various operations of method 400 and may be omitted merely for clarity and ease of description. Additional processes can be provided before, during, and/or after method 400; one or more of these additional processes are briefly described herein. Moreover, not all operations may be needed to perform the disclosure provided herein. Additionally, some of the operations may be performed simultaneously or in a different order than shown in FIG. 4. In some embodiments, one or more other operations may be performed in addition to or in place of the presently-described operations.

Figure 8:
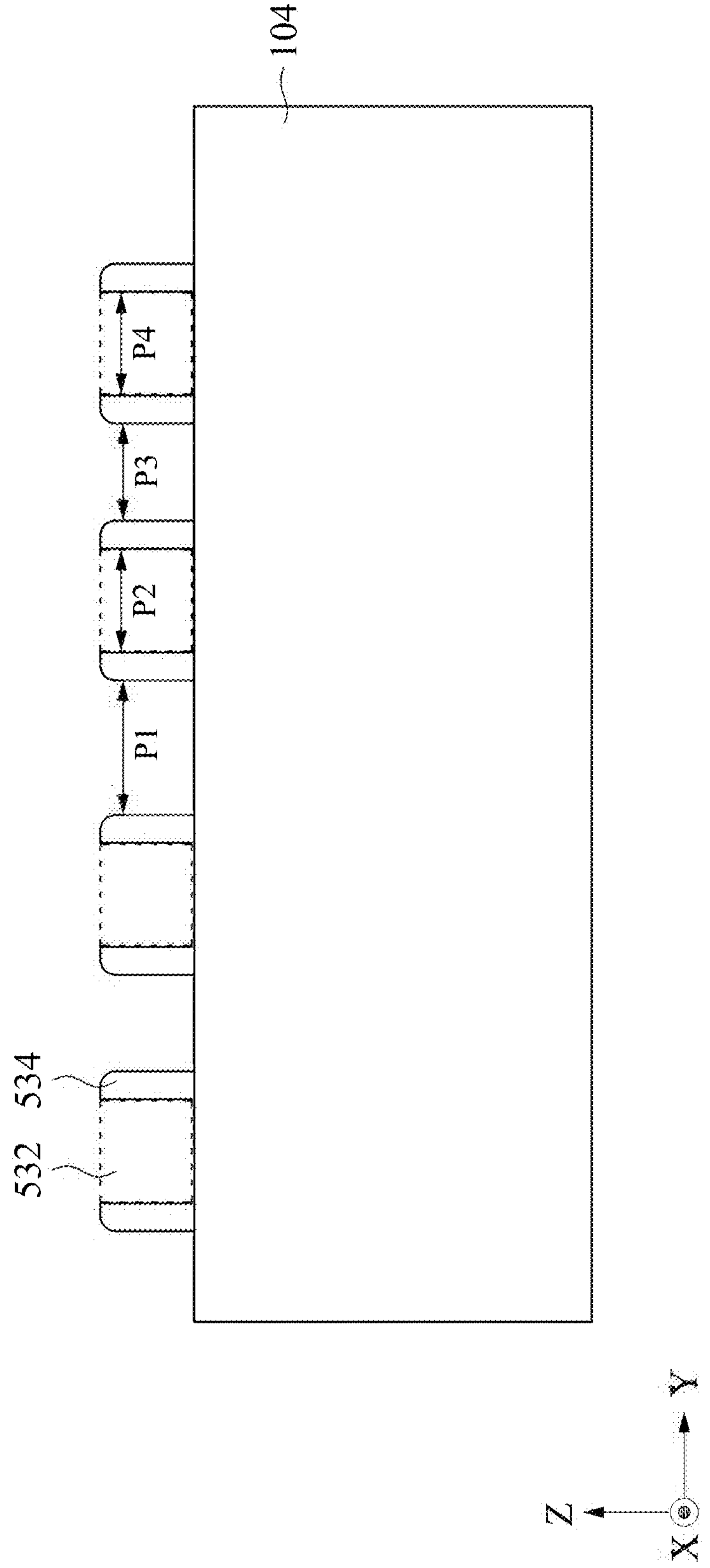
Figure 9:
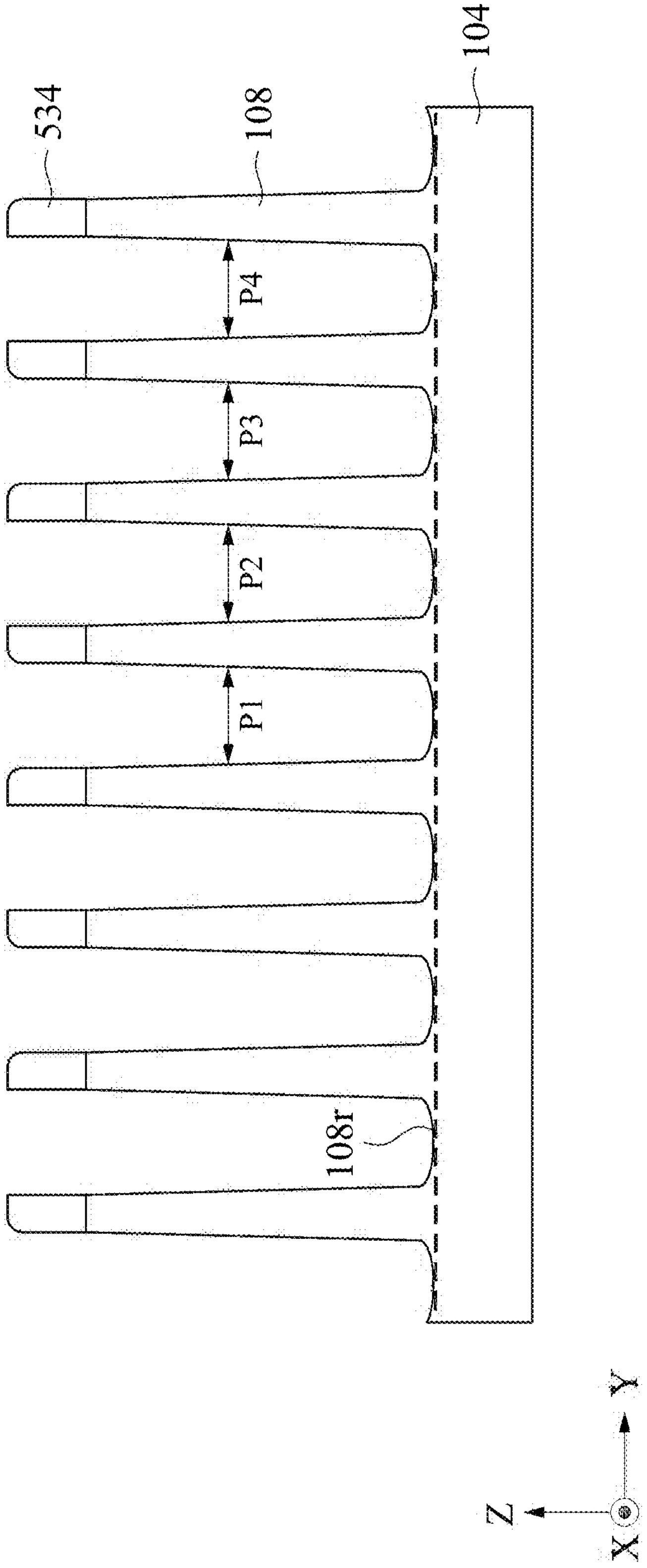
Figure 10:
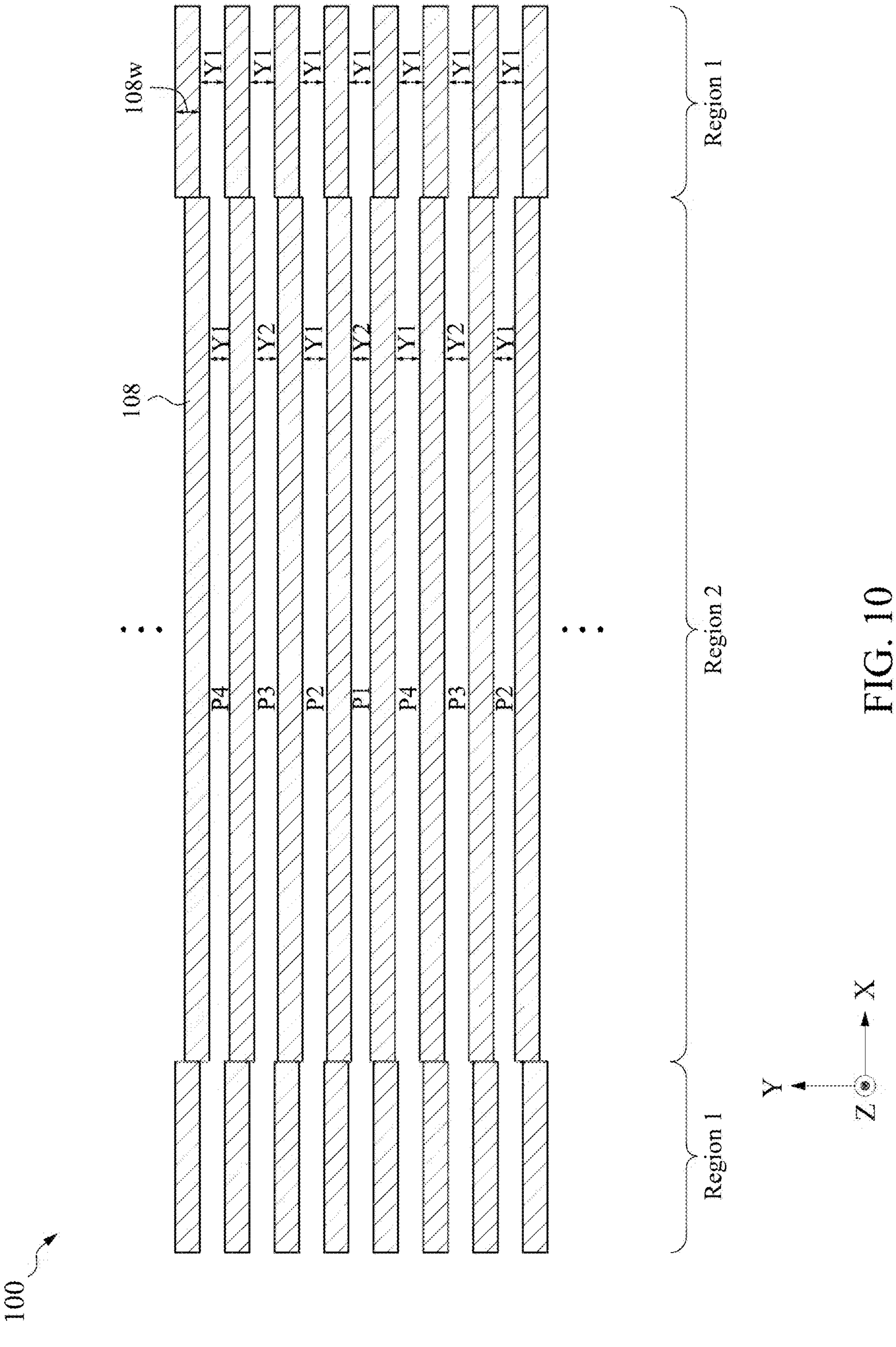
Figure 11:
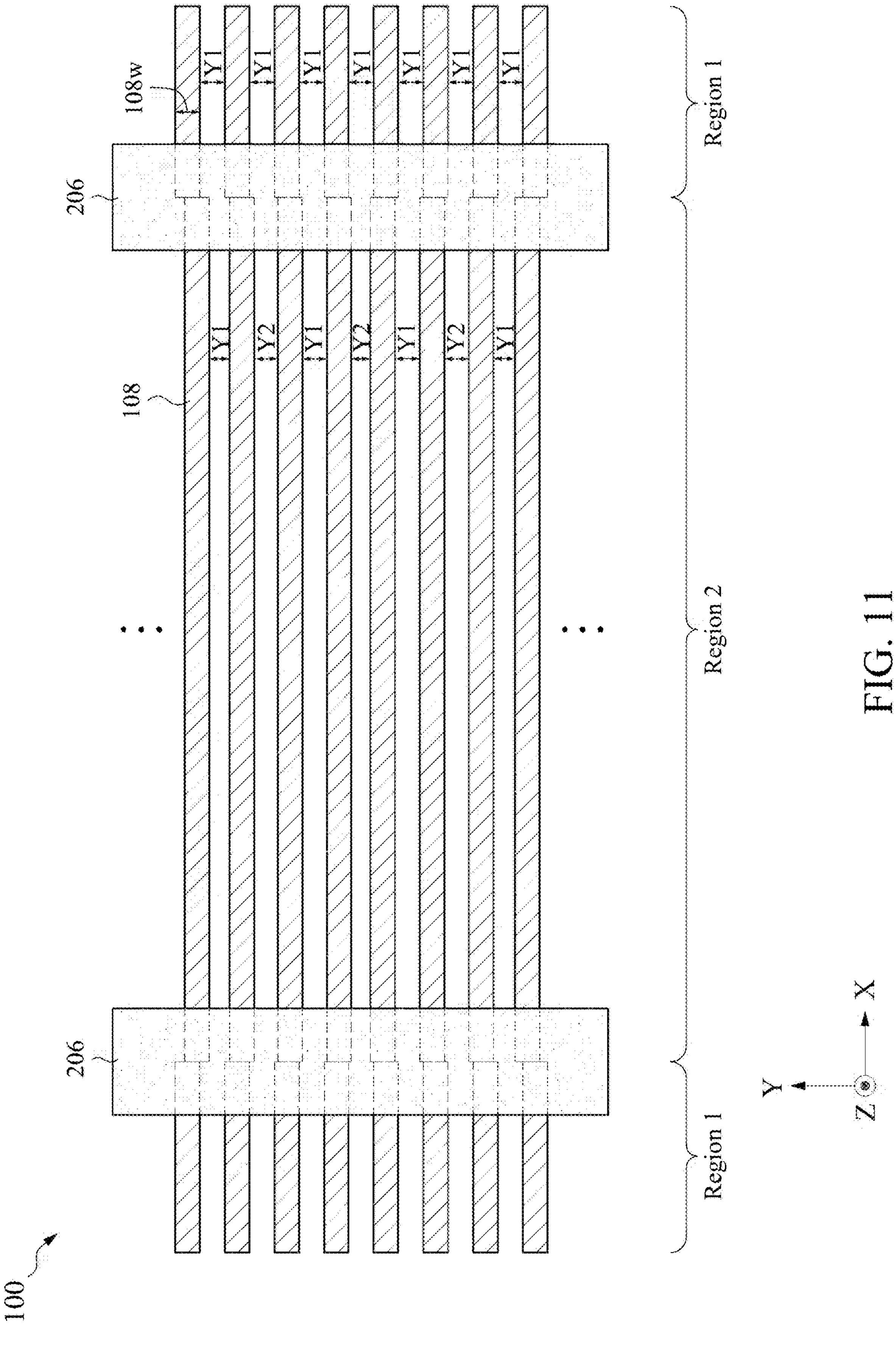
Figure 12:
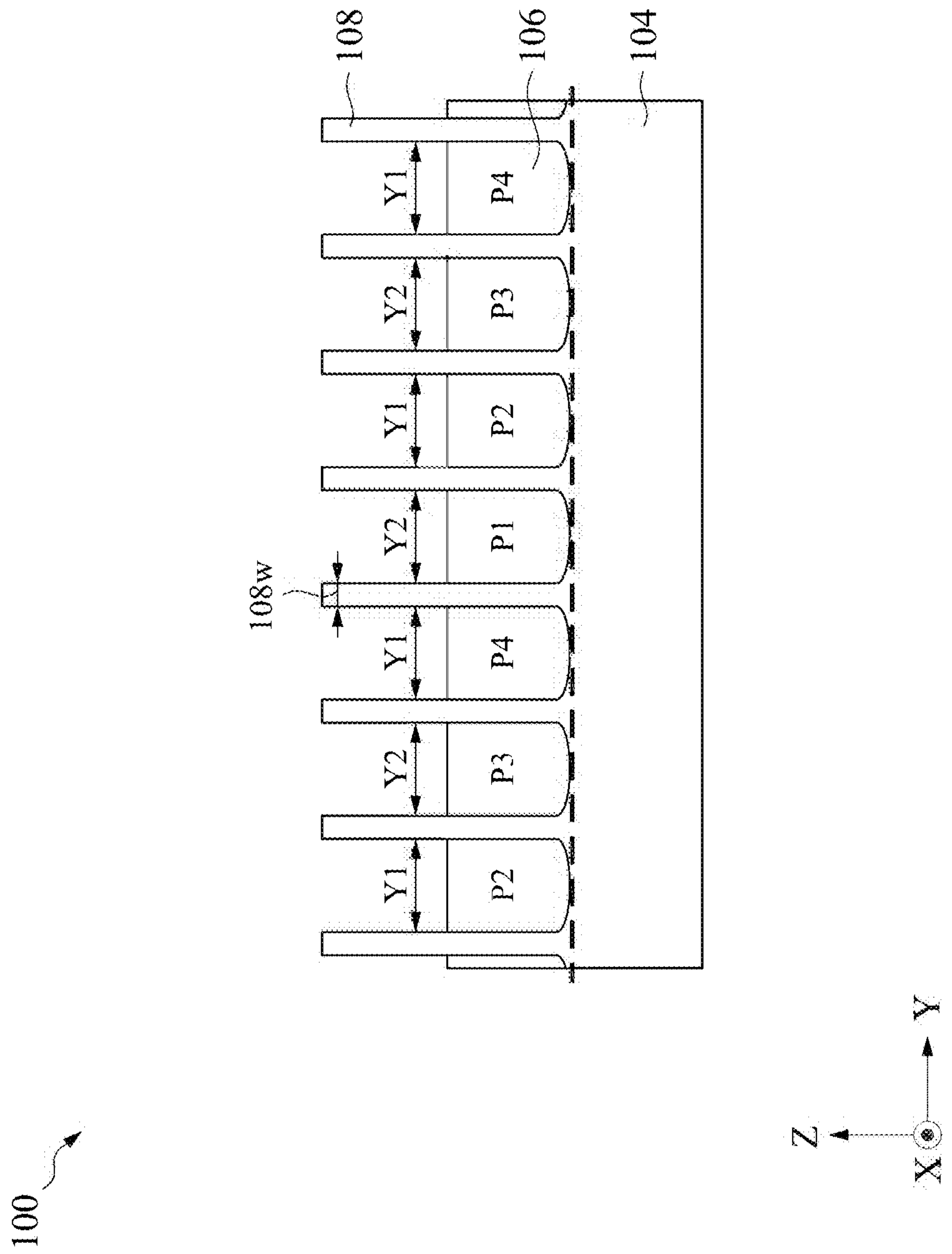
Figure 13:
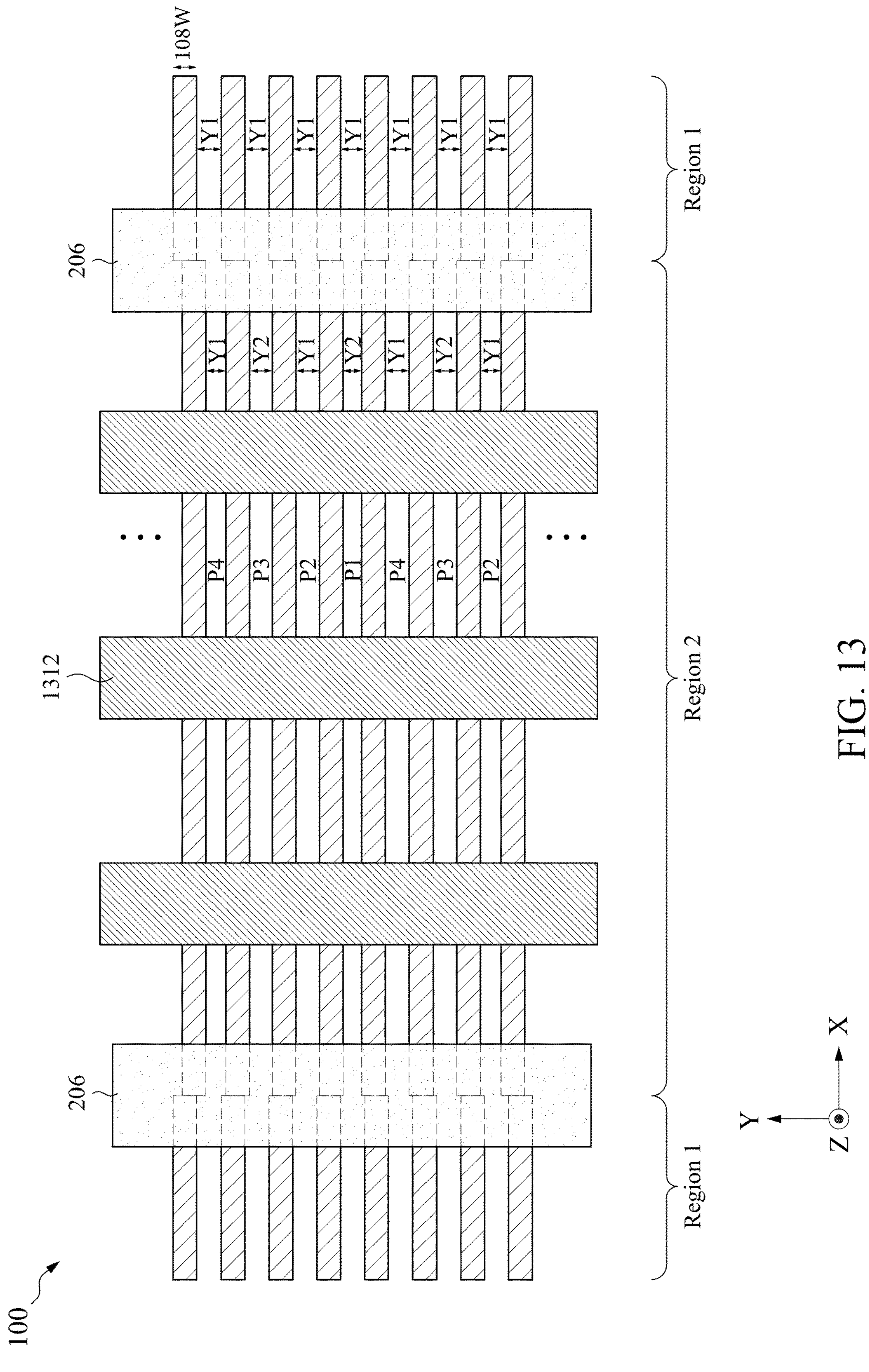

For illustrative purposes, the operations illustrated in FIG. 4 will be described with reference to the example fabrication process for fabricating semiconductor device 100 as illustrated in FIGS. 5-13. FIGS. 5-13 illustrate plan views and cross-sectional views of semiconductor device 100 having optimized fin pitches for substantially uniform source/drain structures at various stages of its fabrication, in accordance with some embodiments. FIGS. 5-9 and 12 illustrate partial cross-sectional views of semiconductor device 100 along line A-A as shown in FIG. 1 at various stages of its fabrication, in accordance with some embodiments. FIGS. 10, 11, and 13 illustrate plan views of semiconductor device 100 as shown in FIG. 1 at various stages of its fabrication, in accordance with some embodiments. Elements in FIGS. 5-13 with the same annotations as elements in FIGS. 1-3 are described above.

Figure 5:
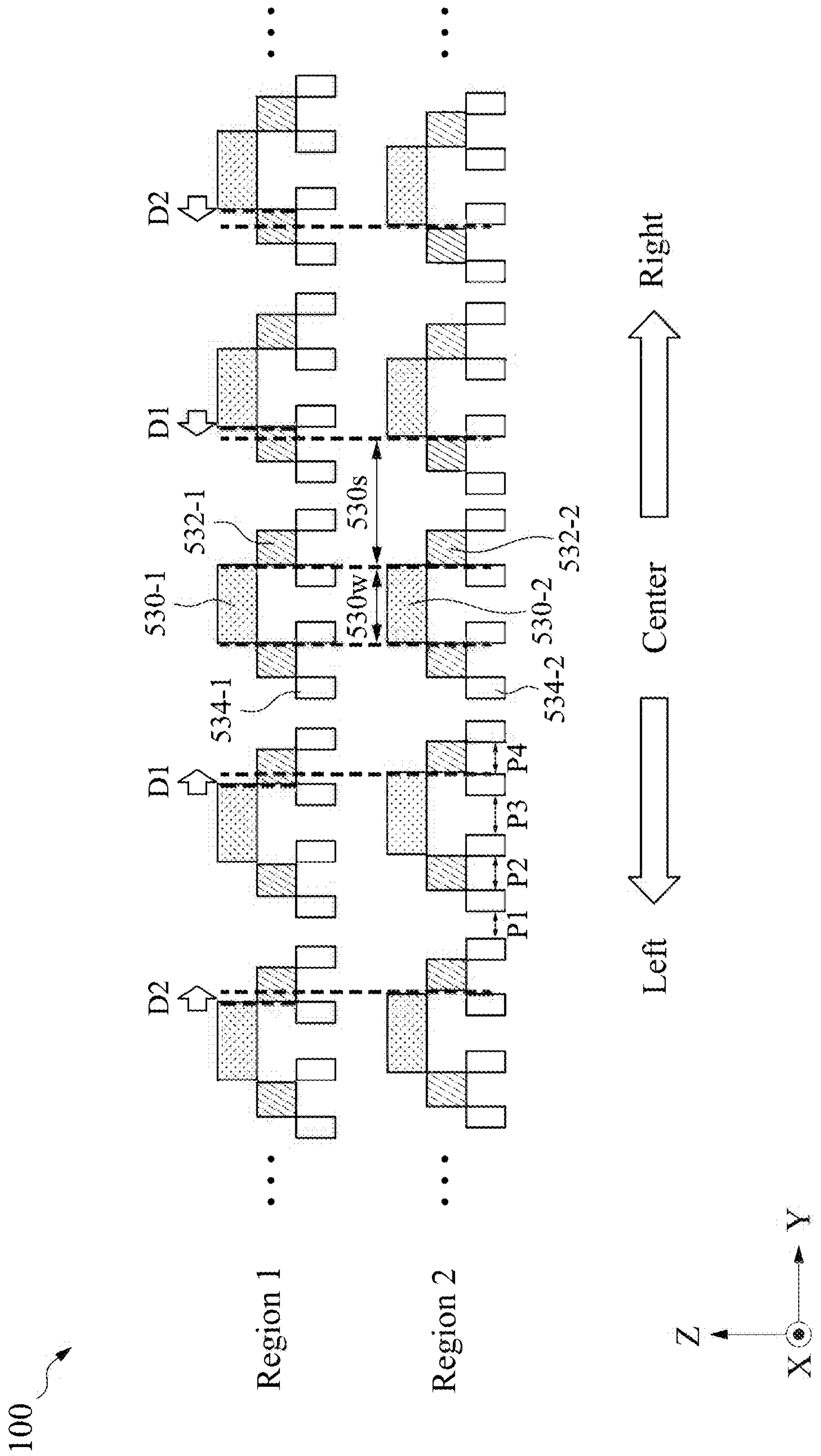
FIGS. 5-13 illustrate plan views and cross-sectional views of a semiconductor device having optimized fin pitches for substantially uniform source/drain structures at various stages of its fabrication, in accordance with some embodiments.

In referring to FIG. 4, method 400 begins with operation 410 and the process of forming, on a substrate, multiple fin structures having a first pitch and a second pitch in an alternate configuration. For example, as shown in FIGS. 5-10, fin structures 108 can be formed on substrate 104. Fin structures 108 can have a first pitch Y1 and a second pitch Y2 in an alternate configuration. FIG. 5 illustrates a partial cross-sectional view of a multi-patterning process to form fin structures 108, in accordance with some embodiments. FIG. 6-9 illustrate partial cross-sectional views of the multi-patterning process to form fin structures 108 at various stages, in accordance with some embodiments. FIG. 10 illustrates a plan view of fin structures 108 formed by the multi-patterning process, in accordance with some embodiments.

In some embodiments, as shown in FIG. 5, the multi-patterning process can use sacrificial patterning structures 530-1 to form first spacers 532-1 in region 1 and sacrificial patterning structures 530-2 to form first spacers 532-2 in region 2. Sacrificial patterning structures 530-1 and 530-2 can be collectively referred to as "sacrificial patterning structures 530." First spacers 532-1 can further act as sacrificial patterning structures to form second spacers 534-1 in region 1 and first spacers 532-2 can further act as additional patterning structures to form second spacers 534-2 in region 2. The detailed process to form first spacers 532-1 and 532-2 (collectively referred to as "first spacers 532") and second spacers 534-1 and 534-2 (collectively referred to as "second spacers 534") are illustrated in FIGS. 6-9.

Figure 6:
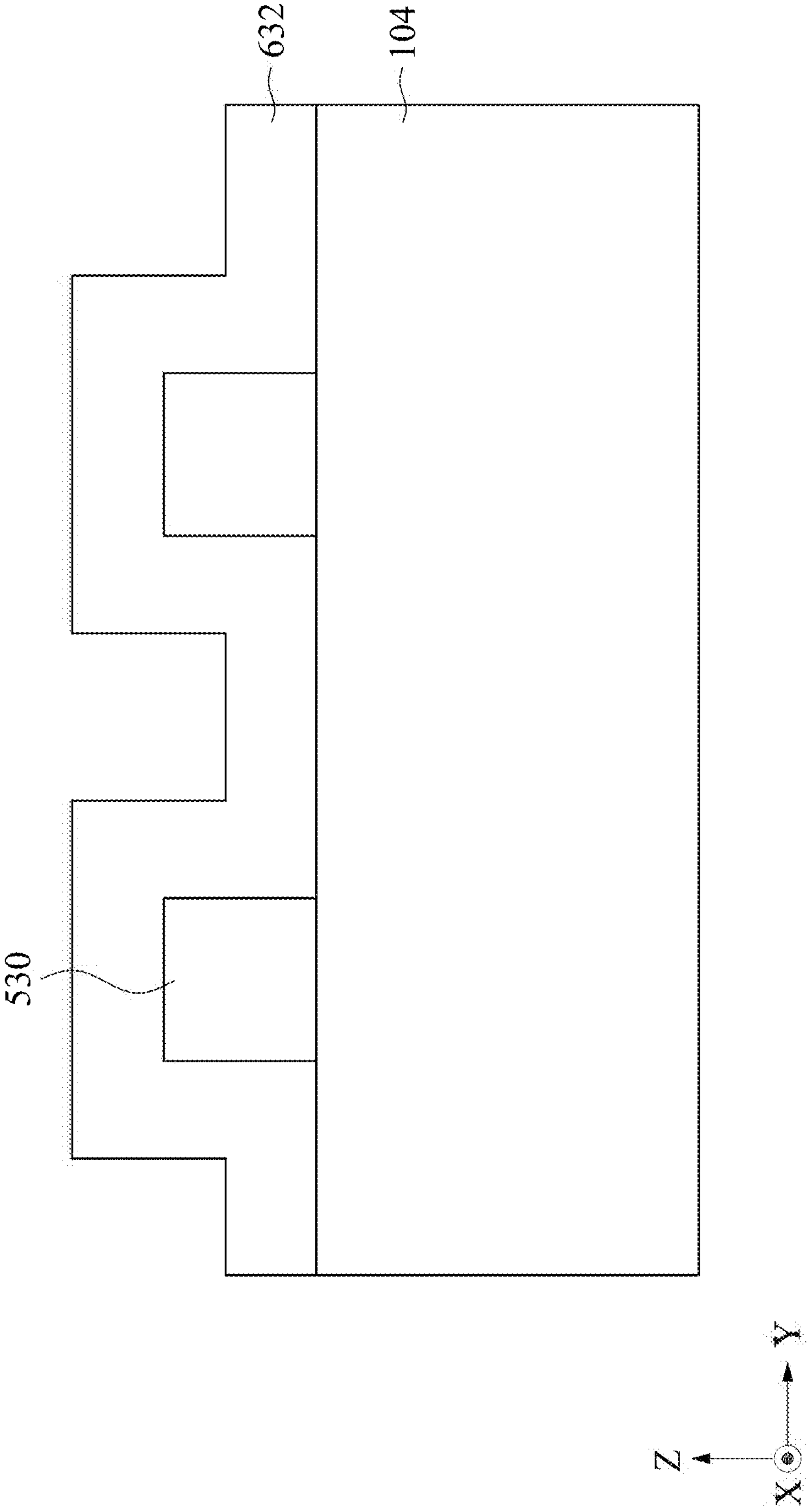
Figure 7:
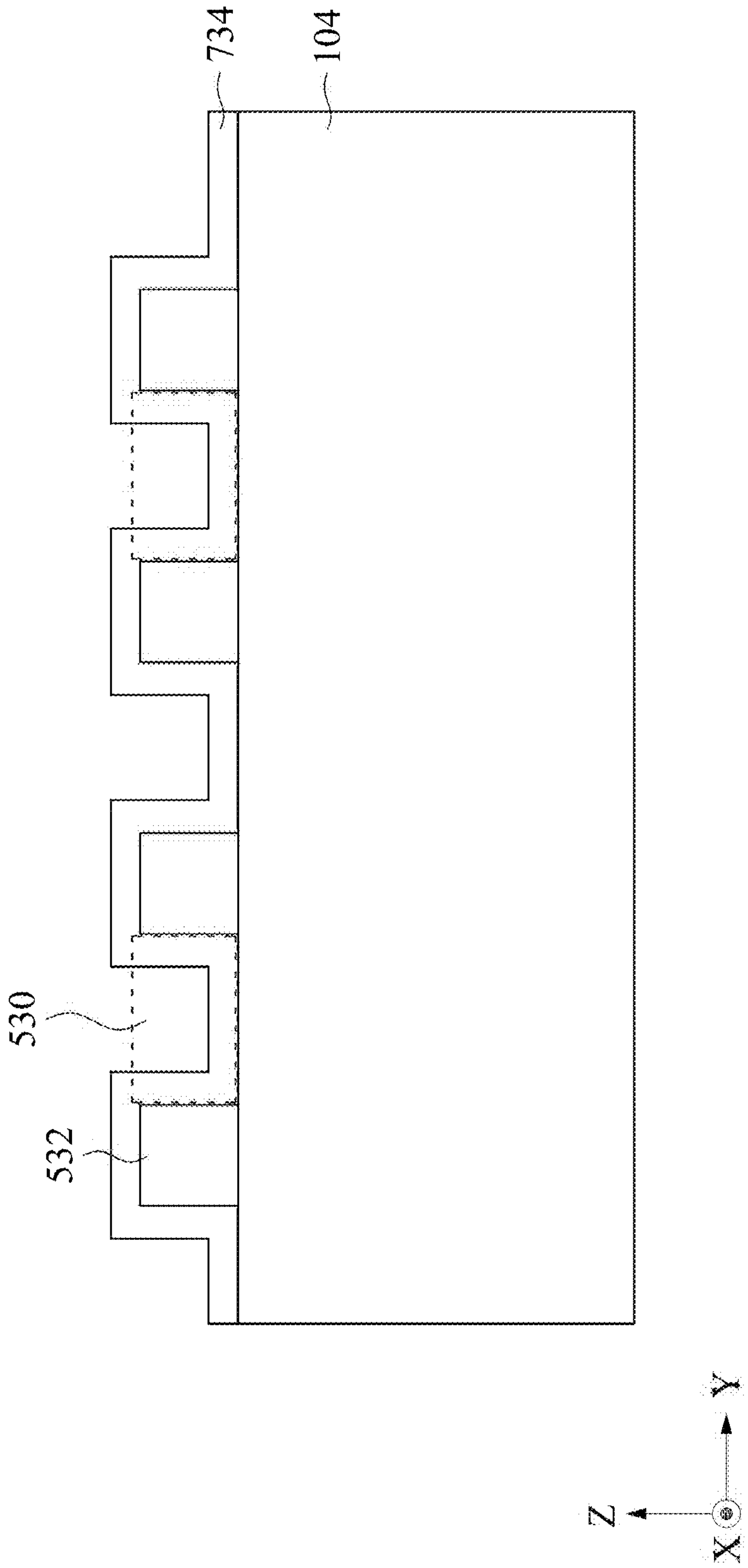

Referring to FIG. 6, a sacrificial layer can be formed over substrate 104 and subsequently patterned using a photolithography process to form sacrificial patterning structures 530. A spacer layer 632 can be conformally deposited on sacrificial patterning structures 530 and substrate 104, as shown in FIG. 6. Referring to FIG. 7, first spacers 532 can be formed along sacrificial patterning structures 530 by anisotropically etching spacer layer 632. As a result, first spacers 532 can become self-aligned to sidewalls of sacrificial patterning structures 530. Subsequently, sacrificial patterning structures 530 can be removed, and a spacer layer 734 can be conformally deposited on first spacers 532 and substrate 104, as shown in FIG. 7. First spacers 532 can act as sacrificial patterning structures to further pattern second spacers 534 in a similar process, as shown in FIG. 8. First spacers 532 can be removed and second spacers 534 can act as sacrificial patterning structures in subsequent anisotropical etching processes to form fin structures 108, as shown in FIGS. 9 and 10.

The above multi-patterning process can be used to form fin structures 108 in region 1 and region 2. In some embodiments, spacing 530*s* and width 530*w* of sacrificial patterning structures 530 along a Y-axis direction can define the pitch and the width (e.g., along the Y-axis direction) of the resulting fin structures 108. In some embodiments, width 530*w* can range from about 25 nm to about 50 nm. In some embodiments, spacing 530*s* can range from about 50 nm to about 100 nm. In some embodiments, as shown in FIGS. 5, 9, and 10, one sacrificial patterning structure 530 can be used to pattern four second spacers 534 and thus four fin structure 108 having pitches P1, P2, P3, and P4. In some embodiments, as shown in FIG. 10, fin structures 108 in region 1 can have common first pitch Y1 and fin structures 108 in region 2 can have first pitch Y1 and second pitch Y2 in an alternate configuration.

In some embodiments, sacrificial patterning structures 530-2 in region 2 can be shifted with various distances from sacrificial patterning structures 530-1 in region 1 to form fin structures 108 having multiple fin pitches in region 2. For example, as shown in FIG. 5, the center sacrificial patterning structures 530-1 and 530-2 in regions 1 and 2 can be aligned. The first left sacrificial patterning structure 530-2 in region 2 can be shifted to the center by distance D1 from the first left sacrificial patterning structure 530-1 in region 1. The first right sacrificial patterning structure 530-2 in region 2 can be shifted to the center by distance D1 from the first right sacrificial patterning structure 530-1 in region 1. Similarly, the second left sacrificial patterning structure 530-2 in region 2 can be shifted to the center by distance D2 from the second left sacrificial patterning structure 530-1 in region 1. The second right sacrificial patterning structure 530-2 in region 2 can be shifted to the center by distance D1 from the second right sacrificial patterning structure 530-1 in region 1. Accordingly, the $n^{th}$ sacrificial patterning structure 530-2 in region 2 can be shifted to the center by distance Dn from the $n^{th}$ sacrificial patterning structure 530-1 in region 1. In some embodiments, distance D2 can be greater than distance D1. In some embodiments, to form fin structures 108 in region 1 having first pitch Y1 and second pitch Y2, distance Dn can be calculated based on spacing 530*s* and width 530*w* of sacrificial patterning structures 530 according to the following equation:

$$Dn = (530w + 530s) \times n \times 5\% - 530w \times 2.5\%$$

In some embodiments, first pitch Y1 can range from about 15 nm to about 25 nm along a Y-axis. In some embodiments, second pitch Y2 can be less than first pitch Y1. In some embodiments, a ratio of second pitch Y2 to first pitch Y1 can range from about 95% to about 99.5%. If the ratio is less than about 95% or greater than about 99.5%, subsequently-formed S/D structures 110 on fin structures 108 in region 2 may be dentate or unmerged, and the device performance and reliability of semiconductor device 100 may be reduced. In some embodiments, with first pitch Y1 and second pitch Y2 in an alternate configuration, fin structures 108 in region 2 can have a substantially uniform recess 108*r* between fin structures 108 and on substrate 104. In some embodiments, bottom surfaces of recess 108*r* between fin structures 108 can be aligned at a substantially same level, as shown in FIG. 9.

In some embodiments, fin structures 108 in region 1 and region 2 can have width 108*w* along a Y-axis ranging from about 3 nm to about 10 nm. In some embodiments, a ratio of first pitch Y1 to width 108*w* can range from about 2 to about 5. If the ratio is less than about 2 or greater than about 5, it would be more difficult to control the fin structure uniformity across substrate 104 and between different substrates. In some embodiments, fin structures 108 in region 1 can have a first fin height along a Z-axis ranging from about 100 nm to about 150 nm. Fin structures 108 in region 2 can have a second fin height along a Z-axis ranging from about 100 nm to about 135 nm. The difference between the first and second fin heights can be due to the fin pitch differences in regions 1 and 2 and etching process variations for different fin pitches. In some embodiments, a ratio of the difference between the first and second fin heights to the first fin height can range from about 2% to about 10%.

In some embodiments, fin structures 108 and substrate 104 can include the same semiconductor material. In some embodiments, fin structures 108 and substrate 104 can include silicon, a compound semiconductor, an alloy semiconductor, or combinations thereof. In some embodiments, fin structures 108 and substrate 104 can include different semiconductor materials. For example, different semiconductor materials or combinations thereof (e.g., silicon germanium, germanium, or silicon germanium/silicon stacks) can be deposited on substrate 104 and subsequently patterned as described above in reference to FIGS. 5-10 to form fin structures 108. For example purposes, semiconductor substrate 104 and fin structures 108 will be described in the context of silicon. Based on the disclosure herein, other semiconductor materials and combinations thereof can be used. These semiconductor materials and their combinations are within the spirit and scope of this disclosure.

In some embodiments, after the formation of fin structures 108, second spacers 534 can be removed. STI regions 106 can be formed between fin structures 108 and isolation structures 206 can be formed to separate region 2 from region 1, as shown in FIGS. 11 and 12. In some embodiments, region 1 having multi-fin devices and region 2 having other devices can be adjacent to (e.g., directly next to) each other and separated by isolation structures 206, as shown in FIG. 11. In some embodiments, region 1 and region 2 can be formed in different areas of substrate 104—for example, not adjacent to (e.g., directly next to) each other as shown in FIG. 11. In some embodiments, more than one region 1 having multi-fin devices can be formed on various regions of substrate 104.

Referring to FIG. 4, in operation 420, a gate structure can be formed on the multiple fin structures. For example, as shown in FIG. 13, sacrificial gate structures 1312 can be formed on fin structures 108. FIG. 13 illustrates a plan view of sacrificial gate structures 1312 formed on fin structures 108 in region 2, in accordance with some embodiments. In some embodiments, sacrificial gate structures 1312 can include a sacrificial gate dielectric (e.g., silicon oxide or silicon oxy-nitride) and a sacrificial gate electrode (e.g., polysilicon), both of which are sequentially deposited and patterned to form sacrificial gate structures 1312. In some embodiments, the number and the density of sacrificial gate structures 1312 shown in FIG. 13 is not limiting and fewer or additional sacrificial gate structures 1312 are possible and within the spirit and the scope of this disclosure. In some embodiments, sacrificial gate structures 1312 can be replaced with metal gate structures 112, as shown in FIGS. 1 and 2, in subsequent processes after the formation for S/D structures 110.

Referring to FIG. 4, in operation 430, a S/D structure is formed adjacent to the gate structure and on the multiple fin structures. For example, as shown in FIGS. 1-3, S/D structures 110 can be formed adjacent to gate structures 112 and on fin structures 108 in region 2. In some embodiments, S/D structures 110 can be epitaxially grown on fin structures 108. In some embodiments, S/D structures 110 on each of fin structures 108 in region 2 can merge with S/D structures 110 on adjacent fin structures 108. In some embodiments, S/D structures 110 can be epitaxially grown by (i) chemical vapor deposition (CVD), such as low pressure CVD (LPCVD), atomic layer CVD (ALCVD), ultrahigh vacuum CVD (UHVCVD), reduced pressure CVD (RPCVD), and other suitable CVD; (ii) molecular beam epitaxy (MBE) processes; (iii) any suitable epitaxial process; or (iv) a combination thereof. In some embodiments, S/D structures 110 can be grown by an epitaxial deposition/partial etch process, which can repeat the epitaxial deposition/partial etch process multiple times. Such repeated deposition/partial etch process can be referred to as a cyclic deposition-etch (CDE) process. The CDE process can reduce epitaxial defects formed during the growth and can control the profiles of S/D structures 110. In some embodiments, S/D structures 110 can be in-situ doped with n-type or p-type dopants during the epitaxial growth process.

In some embodiments, S/D structures 110 can include silicon and can be in-situ doped during an epitaxial growth process using n-type dopants, such as phosphorus and arsenic. In some embodiments, S/D structures 110 can include silicon, silicon germanium, germanium, or III-V materials (e.g., indium antimonide or indium gallium antimonide) and can be in-situ doped during an epitaxial growth process using p-type dopants, such as boron, indium, and gallium. In some embodiments, S/D structures 110 can include one or more epitaxial layers, where each epitaxial layer can have different compositions.

In some embodiments, S/D structures 110 on fin structures 108 in region 2 can be merged. In some embodiments, the merged S/D structures 110 on fin structures 108 in region 2 can be substantially uniform and can have substantially uniform thickness over fin structures 108. In some embodiments, as shown in FIG. 3, first portion 110-1 of S/D structures 110 on one fin structure 108 can have thickness 110-1*t*. Second portion 110-2 of S/D structures 110 on an adjacent fin structure 108 can have thickness 110-2*t*. Third portion 110-3 of S/D structures 110 between adjacent fin structures 108 can have thickness 110-3*t*. In some embodiments, thickness 110-1*t* can be substantially equal to thickness 110-2*t*. In some embodiments, thickness 110-3*t* can be substantially equal to or less than thickness 110-1*t*. In some embodiments, a ratio of thickness 110-3*t* to thickness 110-1*t* or 110-2*t* can range from about 80% to about 100%. If the ratio is less than about 80%, the uniformity of merged S/D structures 110 may be reduced and device performance of semiconductor device 100 may be degraded.

In some embodiments, the formation of S/D structures 110 can be followed by replacement of sacrificial gate structures 1312 with metal gate structures 112, formation of S/D contact structures and gate contact structures, formation of metal lines and metal vias, and formation of interlayer dielectrics, which are not described in detail for clarity.

Various embodiments in the present disclosure provide methods for forming fin structures 108 having optimized fin pitches Y1 and Y2 for substantially uniform S/D structures 110 in semiconductor device 100. In some embodiments, fin structures 108 can be formed on substrate 104. Fin structures 108 in region 2 can have first and second pitches Y1 and Y2 in an alternate configuration. In some embodiments, second pitch Y2 can be less than first pitch Y1. In some embodiments, a ratio of second pitch Y2 to first pitch Y1 can range from about 95% to about 99.5%. Gate structures 112 can be formed on fin structures 108. S/D structures 110 can be formed on fin structures 108 and adjacent to gate structures 112. With fin structures 108 in region 2 having first and second pitches Y1 and Y2 in an alternate configuration, S/D structures 110 can have a more uniform thickness over fin structures 108. Accordingly, device performance and device reliability of semiconductor device 100 can be improved. In some embodiments, the device performance of semiconductor device 100 having optimized fin pitches for substantially uniform S/D structures 110 can be improved by about 3% to about 8%.

In some embodiments, a semiconductor structure includes first, second, and third fin structures on a substrate. A first pitch between the first and second fin structures is different from a second pitch between the second and third fin structures. The semiconductor structure further includes a gate structure on the first, second, and third fin structures and a source/drain (S/D) structure adjacent to the gate structure and on the first, second, and third fin structures.

In some embodiments, a semiconductor device includes multiple fin structures on a substrate. The multiple fin structures have a first pitch and a second pitch in an alternate configuration and the second pitch is different from the first pitch. The semiconductor device further includes a gate structure on the multiple fin structures and a source/drain (S/D) structure adjacent to the gate structure and in contact with the multiple fin structures.

In some embodiments, a method includes forming, on a substrate, multiple fin structures having first and second pitches in an alternate configuration. The first pitch is different from the second pitch. The method further includes forming a gate structure on the multiple fin structures and forming a source/drain (S/D) structure adjacent to the gate structure and on the multiple fin structures.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
- first, second, and third fin structures on a substrate, wherein a first pitch between the first and second fin structures is different from a second pitch between the second and third fin structures;
- a gate structure on the first, second, and third fin structures; and
- a source/drain (S/D) structure adjacent to the gate structure and on the first, second, and third fin structures.

2. The semiconductor structure of claim 1, wherein a ratio of the second pitch to the first pitch ranges from about 95% to about 99.5%.

3. The semiconductor structure of claim 1, wherein the S/D structure comprises:
- a first portion above the first fin structure and having a first thickness;
- a second portion above the second fin structure and having the first thickness; and a third portion connecting the first and second portions and having a second thickness substantially equal to or less than the first thickness.

4. The semiconductor structure of claim 3, wherein a ratio of the second thickness to the first thickness ranges from about 80% to about 100%.

5. The semiconductor structure of claim 1, further comprising:

a fourth fin structure aligned with the second fin structure;

a fifth fin structure adjacent to and on a first side of the fourth fin structure; and a sixth fin structure adjacent to and on a second side of the fourth fin structure, wherein a third pitch between the fourth and fifth fin structures is substantially equal to a fourth pitch between the fourth and sixth fin structures.

6. The semiconductor structure of claim 5, wherein the third pitch is substantially equal to the first pitch.

7. The semiconductor structure of claim 1, wherein the first and second pitches range from about 15 nm to about 25 nm.

8. The semiconductor structure of claim 1, wherein the first, second, and third fin structures have a fin width, a ratio of the first pitch to the fin width ranges from about 2 to about 5.

9. The semiconductor structure of claim 1, further comprising:

a first recess on the substrate between the first and second fin structures; and a second recess on the substrate between the second and third fin structures, wherein bottom surfaces of the first and second recesses are at a substantially same level.

10. A semiconductor device, comprising:

a plurality of fin structures on a substrate, wherein:

the plurality of fin structures have a first pitch and a second pitch in an alternate configuration, and the second pitch is different from the first pitch;

a gate structure on the plurality of fin structures; and a source/drain (S/D) structure adjacent to the gate structure and in contact with the plurality of fin structures.

11. The semiconductor device of claim 10, wherein a ratio of the second pitch to the first pitch ranges from about 95% to about 99.5%.

12. The semiconductor device of claim 10, wherein the S/D structure comprises:

first portions above the plurality of fin structures and having a first thickness; and second portions between the plurality of fin structures and connecting the first portions, wherein the second portions have a second thickness substantially equal to or less than the first thickness.

13. The semiconductor device of claim 12, wherein a ratio of the second thickness to the first thickness ranges from about 80% to about 100%.

14. The semiconductor device of claim 10, further comprising:

an additional plurality of fin structures on the substrate and having a third pitch substantially equal to the first pitch; and an isolation structure between the plurality of fin structures and the additional plurality of fin structures.

15. The semiconductor device of claim 10, wherein each of the plurality of fin structures has a fin width, a ratio of the first pitch to the fin width ranges from about 2 to about 5.

16. The semiconductor device of claim 10, further comprising a plurality of recesses on the substrate between the plurality of fin structures, wherein bottom surfaces of the plurality of recesses are at a substantially same level.

17. A semiconductor device, comprising:

first, second, and third channel structures on a substrate, wherein a first pitch between the first and second channel structures is different from a second pitch between the second and third channel structures;

a gate structure over the first, second, and third channel structures;

a first source/drain (S/D) structure on the first, second, and third channel structures at a first side of the gate structure; and a second S/D structure on the first, second, and third channel structures at a second side of the gate structure opposite to the first side.

18. The semiconductor device of claim 17, wherein a ratio of the second pitch to the first pitch ranges from about 95% to about 99.5%.

19. The semiconductor device of claim 17, wherein each of the first and second S/D structures comprises:

a first portion above the first channel structure and having a first thickness;

a second portion above the second channel structure and having the first thickness; and a third portion connecting the first and second portions and having a second thickness substantially equal to or less than the first thickness.

20. The semiconductor device of claim 19, wherein a ratio of the second thickness to the first thickness ranges from about 80% to about 100%.

* * * * *